US012660139B2

(12) United States Patent
Feng et al.

(10) Patent No.: US 12,660,139 B2
(45) Date of Patent: Jun. 16, 2026

(54) EMC WAVE-FILTER SHIELDING STRUCTURE AND EMC WAVE FILTER

(71) Applicant: SHENZHEN VMAX NEW ENERGY (GROUP) CO., LTD, Shenzhen (CN)

(72) Inventors: Yingying Feng, Shenzhen (CN); Shun Yao, Shenzhen (CN); Xianhu Zhang, Shenzhen (CN); Liangcheng Zhan, Shenzhen (CN)

(73) Assignee: SHENZHEN VMAX NEW ENERGY (GROUP) CO., LTD, Shenzhen (CN)

( * ) Notice: Subject to any disclaimer, the term of this patent is extended or adjusted under 35 U.S.C. 154(b) by 133 days.

(21) Appl. No.: 18/799,128

(22) Filed: Aug. 9, 2024

(65) Prior Publication Data

US 2024/0407145 A1     Dec. 5, 2024

Related U.S. Application Data

(63) Continuation of application No. PCT/CN2023/117077, filed on Sep. 5, 2023.

(30) Foreign Application Priority Data

Nov. 29, 2022     (CN) .......................... 202211517907.6

(51) Int. Cl.
*H05K 9/00* (2006.01)

(52) U.S. Cl.
CPC .................................... *H05K 9/002* (2013.01)

(58) Field of Classification Search
CPC .... H05K 9/002; H05K 9/0049; H05K 5/0247; H05K 5/0217; H05K 7/2039; H05K 7/20927; H05K 7/20254; H05K 7/20; H05K 7/20272; H05K 7/20418; H05K 7/2049; H05K 7/20872; Y02T 10/70; Y02T 10/7072

See application file for complete search history.

(56) References Cited

U.S. PATENT DOCUMENTS

2020/0253094 A1* 8/2020 Liu .................... H05K 7/20927

FOREIGN PATENT DOCUMENTS

| CN | 201986243 U | 9/2011 |
|----|-------------|--------|
| CN | 106129671 A | 11/2016 |
| CN | 207099040 U | 3/2018 |

(Continued)

OTHER PUBLICATIONS

International Search Report of PCT/CN2023/117077, Dec. 19, 2023.

*Primary Examiner* — Abhishek M Rathod
(74) *Attorney, Agent, or Firm* — Troutman Pepper Locke LLP; Tim Tingkang Xia, Esq.

(57) ABSTRACT

The present invention discloses an EMC wave-filter shielding structure including an EMC filter board; a lower shield cover that is installed on one side of the EMC filter board, and connected with the EMC filter board around to form a shielding cavity; a X capacitor, a Y capacitor, a first filter inductor and a second filter inductor that are all arranged in the shielding cavity and correspondingly connected with the EMC filter board, respectively; and an upper shield cover that is installed on the other side of the EMC filter board backing toward the shielding cavity, and directly opposite to the lower shield cover. The present invention increases the distance between an electromagnetic interference source and a control signal, and enhancing quality of control signals.

11 Claims, 3 Drawing Sheets

(56)     References Cited

FOREIGN PATENT DOCUMENTS

| | | | | | |
|---|---|---|---|---|---|
| CN | 208285728 | U | | 12/2018 | |
| CN | 209594198 | U | | 11/2019 | |
| CN | 214413322 | U | * | 10/2021 | |
| CN | 114759892 | A | * | 7/2022 | .............. H03H 1/00 |
| CN | 115802734 | A | | 3/2023 | |
| JP | 2010135960 | A | | 6/2010 | |

* cited by examiner

EMC WAVE-FILTER SHIELDING STRUCTURE AND EMC WAVE FILTER

CROSS-REFERENCE TO RELATED PATENT APPLICATION

This application is a continuation application of International Patent Application No. PCT/CN2023/117077, filed on Sep. 5, 2023, which itself claims priority to Chinese Patent Application No. CN 202211517907.6 filed in China on Nov. 29, 2022. The disclosures of the above applications are incorporated herein in their entireties by reference.

FIELD OF THE INVENTION

The present invention relates to the technical field of wave filters of battery chargers for new energy vehicles, in particular to an EMC wave-filter shielding structure and an EMC wave filter that are particularly suitable for new energy vehicles.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

As demands for energy saving and emission reduction as well as air pollution control have been raised increasingly, new energy vehicles gradually become commercialized in the market, while electric vehicles have progressed to dominate the market of new energy vehicles. Among them, an input-end AC wave filter (AC filter) and an output-end HV wave filter (high-voltage filter) of an on-board charger (OBC) act as an important component of electric vehicles, and these two wave filters raise high requirements for electromagnetic compatibility (EMC).

At present, for the input-end AC wave filter and the output HV wave filter of the on-board charger OBC that appear on the market, it is usual to directly install EMC wave filter apparatuses such as a X capacitor, a Y capacitor and a filter inductor on a main power circuit board inside a housing by way of soldering and set up a barrier isolation apparatus on the housing and the main power circuit board; however, because it is unable to absolutely cover gaps between each EMC waver filter apparatus and the housing in a horizontal direction by the barrier, it is unable to absolutely shelter from the electromagnetic waves generated from each EMC waver filter apparatus such as a X capacitor, a Y capacitor and a filter inductor, resulting in electromagnetic side leakage, which exerts a strong influence on the operation of the peripheral apparatuses and module circuits around each EMC waver filter apparatus (in the case that the above EMC waver filter apparatuses are used as an exposed interference source influencing the control signal quality of the main power circuit board), so that the on-board charger OBC is subjected to electromagnetic interference caused by the input-end AC wave filter and the out-end HV wave filter during operating. In addition, the shielding structure of this EMC wave filter only partially functions as an electromagnetic shield for each EMC waver filter apparatus such as a X capacitor, a Y capacitor, and a filter inductor in the filter housing, but for the external environment and space of the filter housing, it has a finite electromagnetic shielding effect, as a result, strong electromagnetic leakage and space radiation have an influence on EMC performance and stability of an entire vehicle.

Therefore, how to enhance the electromagnetic shielding performance of the EMC waver filter apparatus of the input-end AC wave filter and the output-end HV wave filter for an on-board charger OBC, so as to reduce the electromagnetic interference of the electromagnetic leakage of the EMC waver filter apparatus to other apparatuses inside the EMC waver filter and the external environmental space, is a technical problem that needs to be solved urgently in this technical field.

SUMMARY OF THE INVENTION

In order to solve the technical problem existing in the prior art how to enhance the electromagnetic shielding performance of the EMC waver filter apparatus of the input-end AC wave filter and the output-end HV wave filter for an on-board charger OBC, so as to reduce the electromagnetic interference of the electromagnetic leakage of the EMC waver filter apparatus to other apparatuses inside the EMC waver filter and the external environmental space, the present invention proposes an EMC wave-filter shielding structure and an EMC wave filter that are particularly suitable for new energy vehicles.

In order to solve the above technical problem, the technical scheme adopted in the present invention is to provide an EMC wave-filter shielding structure, comprising:

an EMC filter board;

a lower shield cover that is installed on one side of the EMC filter board, and connected with the EMC filter board around to form a shielding cavity;

a X capacitor, a Y capacitor, a first filter inductor and a second filter inductor that are all arranged in the shielding cavity and correspondingly connected with the EMC filter board, respectively; and an upper shield cover that is installed on the other side of the EMC filter board backing toward the shielding cavity, and directly opposite to the lower shield cover.

Further, the EMC wave-filter shielding structure further includes a connecting holder, which is arranged in the shielding cavity and connected with the EMC filter board; the first filter inductor and the second filter inductor are installed on the connecting holder.

Preferably, the connecting holder includes a connecting plate, of which one surface is connected with the EMC filter board through a plurality of connecting supports, and the first filter inductor and the second filter inductor are installed on the other surface of the connecting plate backing toward the connecting supports.

Preferably, the X capacitor and the Y capacitor are arranged between the connecting plate and the EMC filter board, and correspondingly soldered on the EMC filter board, respectively.

In an embodiment, a folded edge is set on a peripheral side of the top end of the lower shield cover close to the EMC filter board, and the folded edge is provided with a plurality of threaded holes; a plurality of dodging holes that are directly opposite to a plurality of the threaded holes in a one-to-one manner are set on a peripheral side of the EMC filter plate; a plurality of sinking stands that are directly opposite to a plurality of the threaded holes in a one-to-one manner are set on a peripheral side of the upper shield cover, and each sinking stand is provided with a through hole; thus, the upper shield cover, the EMC filter board and the lower shield cover are connected with each other as a whole by way of passing a plurality of screws through the through holes, the dodging holes and the threaded holes directly opposite to each other.

Preferably, a thermally-conductive adhesive is applied between the EMC filter board and the X capacitor, Y capacitor, first filter inductor and second filter inductor in the shielding cavity.

The present invention further provides an EMC waver filter, comprising a housing, a main power circuit board installed inside the housing, and a power transmission terminal installed at one end of the housing, wherein the EMC waver filter further includes the EMC wave-filter shielding structure arranged inside the housing, one end of the EMC filter board is connected with the power transmission terminal, and the other end of the EMC filter board is connected with the main power circuit board through a power connection terminal.

One end of the upper shield cover is fixedly connected to the EMC filter board through a supporting foot, and the other end stands against the power connection terminal.

One end of the EMC filter board is provided with a plurality of soldering slots, and one end of the power transmission terminal 8 extending into the housing is soldered to a plurality of the soldering slots in a one-to-one correspondence manner through a plurality of power transmission pins.

The EMC filter acts as an AC filter of an input end of an on-board charger OBC or a HV filter of an output end of an on-board charger OBC.

Compared with the prior art, the EMC waver filter shielding structure provided by the present invention make the filter apparatus independent of the main power circuit board as a whole, increasing the distance between an electromagnetic interference source and a control signal, and raising the quality of the control signals. In addition, the arrangement of the EMC waver filter independent of the main power circuit board makes it possible to reasonably utilize the space in the vertical direction of the housing, and conducive to reducing the size of the main power board and the plane size of the housing, thereby reducing the installation space of the on-board charger on an entire vehicle, and making the arrangement and installation for an entire vehicle more flexible.

BRIEF DESCRIPTION OF THE DRAWINGS

In order to explain the technical solutions of the present invention more clearly, the drawings needing to be used in the descriptions of the embodiments are briefly introduced hereinafter. Obviously, the drawings in the following descriptions are only exemplary, and for those of ordinary skills in the art, other drawings may also be derived and obtained based on the provided drawings without going through any creative work.

Where, 1—bottom shell; 2—upper lid; 3—main power circuit board; 4—EMC waver filter; 41—EMC filter board; 411—soldering slot; 42—first filter inductor; 43—second filter inductor; 44—X capacitor; 45—Y capacitor; 46—connecting holder; 461—connecting plate; 462—connecting support; 5—upper shield cover; 51—supporting foot; 6—lower shield cover; 7—screw; 8—power transmission terminal; 9—power connection terminal.

DETAILED DESCRIPTION OF SOME EMBODIMENTS

In order to make the technical problem, technical solution and beneficial effect to be solved by the present invention more clearly understood, we shall further describe the present invention in detail in combination with the drawings and examples as follows. It should be understood that the specific examples described herein are only used to explain the present invention, not to pose a limitation on the present invention.

Figure 1:
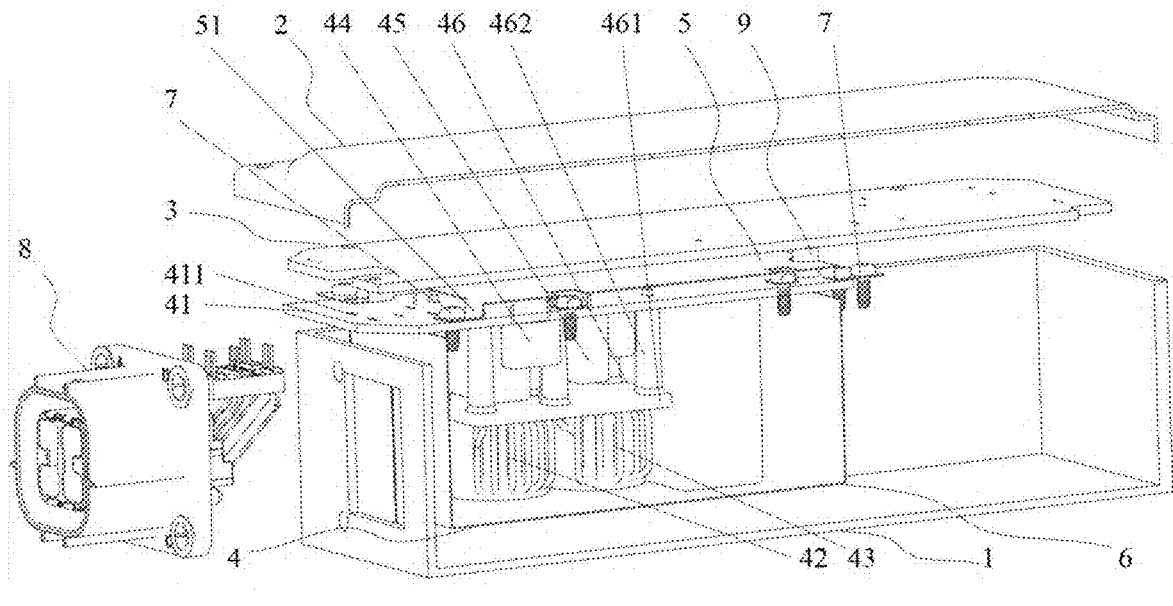
FIG. 1 shows an exploded view of an exampled EMC wave filter proposed by the present invention.
Figure 2:
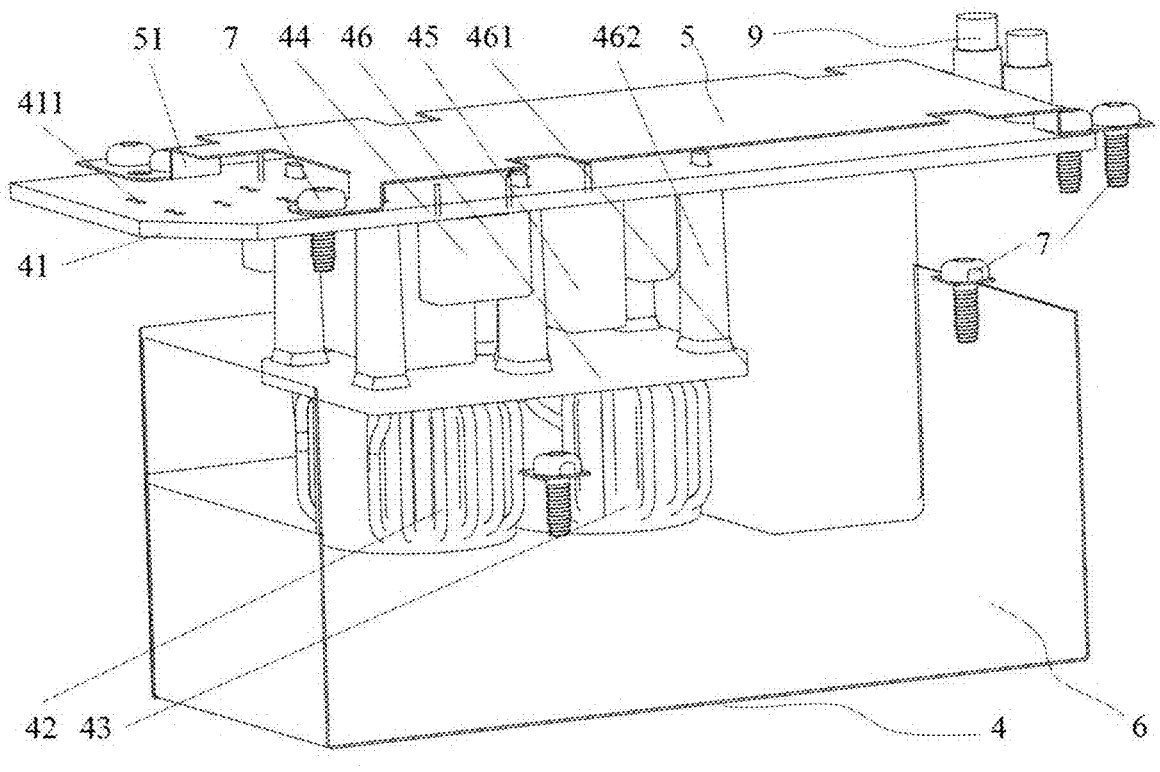
FIG. 2 shows an exploded view of the EMC wave-filter shielding structure in FIG. 1.
Figure 3:
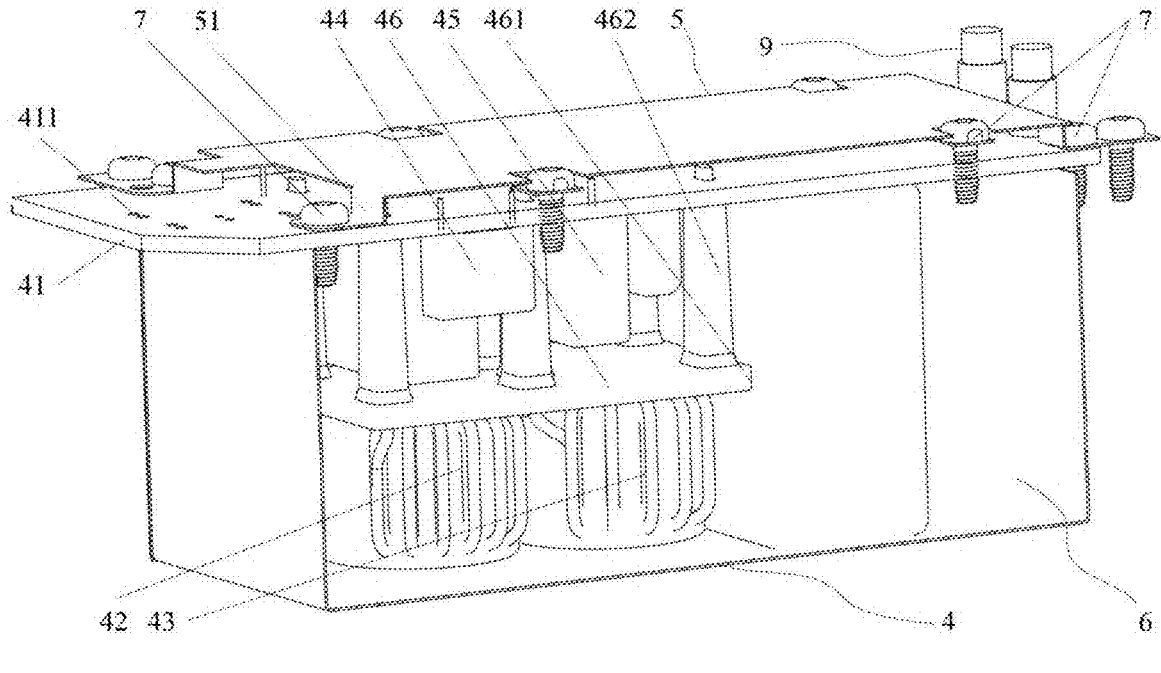
FIG. 3 shows a view of the already-installed EMC wave-filter shielding structure in FIG. 2.

Referring FIGS. 1-3 in their entirety, the EMC wave-filter shielding structure provided by the present invention includes: an EMC filter board 41, a lower shield cover 6, a X capacitor 44, a Y capacitor 45, a first filter inductor 42, a second filter inductor 43 and an upper shield cover 5;

wherein the lower shield cover 6 is installed on one side of the EMC filter board 41, and connected with the EMC filter board 41 around to form a shielding cavity; the X capacitor 44, the Y capacitor 45, the first filter inductor 42 and the second filter inductor 43 are all arranged in the shielding cavity and correspondingly connected with the EMC filter board 41, respectively; the upper shield cover 5 is installed on the other side of the EMC filter board 41 backing toward the shielding cavity, and the upper shield cover 5 fits with the lower shield cover 6, so that the upper shield 5 and the lower shield 6 are connected with each other around to form an electromagnetic shielding cavity; thus, the X capacitor 44, the Y capacitor 45, the first filter inductor 42 and the second filter inductor 43 and the EMC filter board 41 are housed in the electromagnetic shielding cavity. In this example, the upper shield cover 5 and the lower shield cover 6 are all made of metal.

In this example, the shielding structure of the EMC wave-filter 4 further includes a connecting holder 46, which is arranged in the shielding cavity and connected with the EMC filter board 41. The first filter inductor 42 and the second filter inductor 43 are installed on the connecting holder 46. As an embodiment, the connecting holder 46 includes a connecting plate 461, of which one surface is connected with the EMC filter board 41 through a plurality of connecting supports 462, and the first filter inductor 42 and the second filter inductor 43 are installed on the other surface of the connecting plate 461 backing toward the connecting supports 462, and connected to the EMC filter board 41 through the connecting plate 461 and the connecting supports 462. As an embodiment, the first filter inductor 42 and the second filter inductor 43 are installed on the other surface of the connecting plate 461 backing toward the connecting supports 462 by way of wave soldering.

As an embodiment, the X capacitor 44 and the Y capacitor 45 are arranged between the connecting plate 461 and the EMC filter board 41, and correspondingly soldered on the EMC filter board 41, respectively. As a preferred embodiment, the X capacitor 44 and the Y capacitor 45 are fixedly installed on a copper foil of the EMC filter board 41 by way of wave soldering; as the X capacitor 44 and the Y capacitor 45 are arranged between the connecting plate 461 and the EMC filter board 41, it is possible to achieve decreases in the plane area and the wiring length of the copper foil on the EMC filter board 41 by way of making use of the installation space in the height direction between the lower part of the EMC filter board 41 and the upper part of the connecting plate 461, so as to enable the EMC wave filter 4 to be integrated and miniaturized, and reserve a sufficient space for installing the lower shield cover 6.

In an example, a folded edge is set on a peripheral side of the top end of the lower shield cover 6 close to the EMC filter board 41, and the folded edge is provided with a plurality of threaded holes; a plurality of dodging holes that are directly opposite to a plurality of threaded holes in a one-to-one manner are set on a peripheral side of the EMC filter plate 41, and the dodging holes may be bare holes or threaded holes; a plurality of sinking stands that are directly opposite to a plurality of threaded holes in a one-to-one manner are set on a peripheral side of the upper shield cover 5, and each sinking stand is provided with a through hole; thus, the upper shield cover 5, the EMC filter board 41 and the lower shield cover 6 are connected with each other as a whole by way of passing a plurality of screws 7 or bolts through the through holes, the dodging holes and the threaded holes directly opposite to each other. As an embodiment, the folded edge positioned on the top end of the lower shield cover 6 is soldered to one side of the EMC filter board 41 facing the lower shield cover 6, so as to ensure that the EMC filter board 41, and the installed X capacitor 44, Y capacitor 45, first filter inductor 42 and second filter inductor 43 are all housed in the shielding cavity.

As a preferred embodiment, a thermally-conductive adhesive is applied between the EMC filter board 41 and the X capacitor 44, Y capacitor 45, first filter inductor 42 and second filter inductor 43 in the shielding cavity. In an embodiment, the shielding cavity enclosed by the lower shield cover 6 and the EMC filter board 41 is filled with the thermally-conductive adhesive to enable the bottoms (the end away from the EMC filter board 41) of the X capacitor 44 and the Y capacitor 45 to be partially encapsulated, and enable the first filter inductor 42 and the second filter inductor 43 to be fully encapsulated, so as to dissipate heat from the X capacitor 44, the Y capacitor 45, the first filter inductor 42 and the second filter inductor 43, meanwhile fix and restrict the first filter inductor 42 and the second filter inductor 43 on the bottom end of the connecting holder 46 that is installed in a height direction and extends downwards away from the EMC filter board 41 (the lower end surface of the connecting plate 461 hanging on the connecting holder 46 away from the EMC filter board 41).

As shown in FIG. 1, the present invention further provides an EMC waver filter 4, which includes a housing, a main power circuit board 3 installed inside the housing, and a power transmission terminal 8 installed at one end of the housing. The EMC waver filter 4 further includes the above-mentioned EMC wave-filter shielding structure arranged inside the housing, wherein one end of the EMC filter board 41 is connected with the power transmission terminal 8, and the other end of the EMC filter board 41 is connected with the main power circuit board through a power connection terminal 9.

In this example, the other end of the EMC filter board 41 is connected with the main power circuit board through two power connection terminals 9; of the upper shield cover 5 one end is fixedly connected to the EMC filter board 41 through a supporting foot 51, and the other end stands against the power connection terminal 9. As a preferred embodiment, the supporting foot 51 extending to the EMC filter board 41 is arranged on one end of the upper shield cover 5, and a through hole is set on a supporting bottom plate of the supporting foot 51 standing against the EMC filter board 41; a dodging hole directly opposite to the through hole of the supporting bottom plate is set on a peripheral side of the EMC filter board 41, and a threaded hole directly opposite to the through hole of the supporting bottom plate is set on the folded edge of the peripheral side of the top end of the lower shield cover 6 close to the EMC filter board 41; thus, the upper shield cover 5, the EMC filter board 41 and the lower shield cover 6 are connected with each other as a whole by way of passing a plurality of screws 7 or bolts through the through hole of the supporting bottom plate of the supporting foot 51, the dodging hole of the EMC filter board 41 and the threaded hole of the lower shield cover 6 directly opposite to each other, so that the upper shield cover 5 and the lower shield cover 6 overlap with each other in their connection area and reduce a hollow area, to cover the X capacitor 44, the Y capacitor 45, the first filter inductor 42, the second filter inductor 43 and the pin area on the EMC filter board 41 to a maximum extent, abate the signal interference to the peripheral circuit and the space of the main power circuit board arising from the electromagnetic leakage of the filter apparatuses, making it possible to arrange a control circuit and a power source on a projection area of the EMC wave filter 4 on the main power circuit board without susceptibility to the electromagnetic interference, raising space utilization on the main power circuit board, and making more reasonable use of the internal space of the housing.

In this example, one end of the EMC filter board 41 is provided with a plurality of soldering slots 411, and one end of the power transmission terminal 8 extending into the housing is soldered to a plurality of soldering slots 411 in a one-to-one correspondence manner through a plurality of power transmission pins, as shown in FIG. 1.

In this example, the housing includes a bottom shell 1, an upper lid 2 installed at the top end of the bottom shell 1, the upper shield cover 5, the lower shield cover 6 and the shielding structure of the EMC wave-filter 4 formed together from the EMC filter board 41, the X capacitor 44, the Y capacitor 45, the first filter inductor 42 and the second filter inductor 43; for the shielding structure of the EMC wave-filter 4, the upper shield 5, the lower shield 6 and the EMC filter plate 41 are connected with each other around to form a cavity sealing the EMC apparatuses such as the X capacitor 44, the Y capacitor 45, the first filter inductor 42 and the second filter inductor 43; in addition, this shielding structure of the EMC wave filter 4 is fixedly installed on the bottom shell 1 of the housing by way of screwing the EMC filter board 41 or fixing it by a screw 7, so as to enable the EMC filter board 4 to achieve input power and output power through the power transmission terminal 8, and enable the EMC filter board 41 and the main power circuit board to achieve power transmission through the power connection terminal 9. The housing and the upper lid 2 are combined with each other to form a hermetic space, which can reach a high level of protection (IP67 rating), and this hermetic space is also another shield for the EMC wave filter 4, so as to minimize the environmental leakage of interference signals.

The EMC wave-filter shielding structure provided by the present invention is independent of the main power circuit board, making the filter apparatuses causing serious electromagnetic interference independent as a whole, increasing the distance between the electromagnetic interference source and the control signal of the main power circuit board, and enhancing quality of control signals. In addition, the EMC waver filter independent of the main power circuit board enables the space in the vertical direction of the housing to be reasonably utilized, making it easy to reduce the size of the main power board and the plane size of the housing and decrease the installation space of the on-board charger on an entire vehicle, and making the layout and installation of an entire vehicle more flexible.

Figure 4:
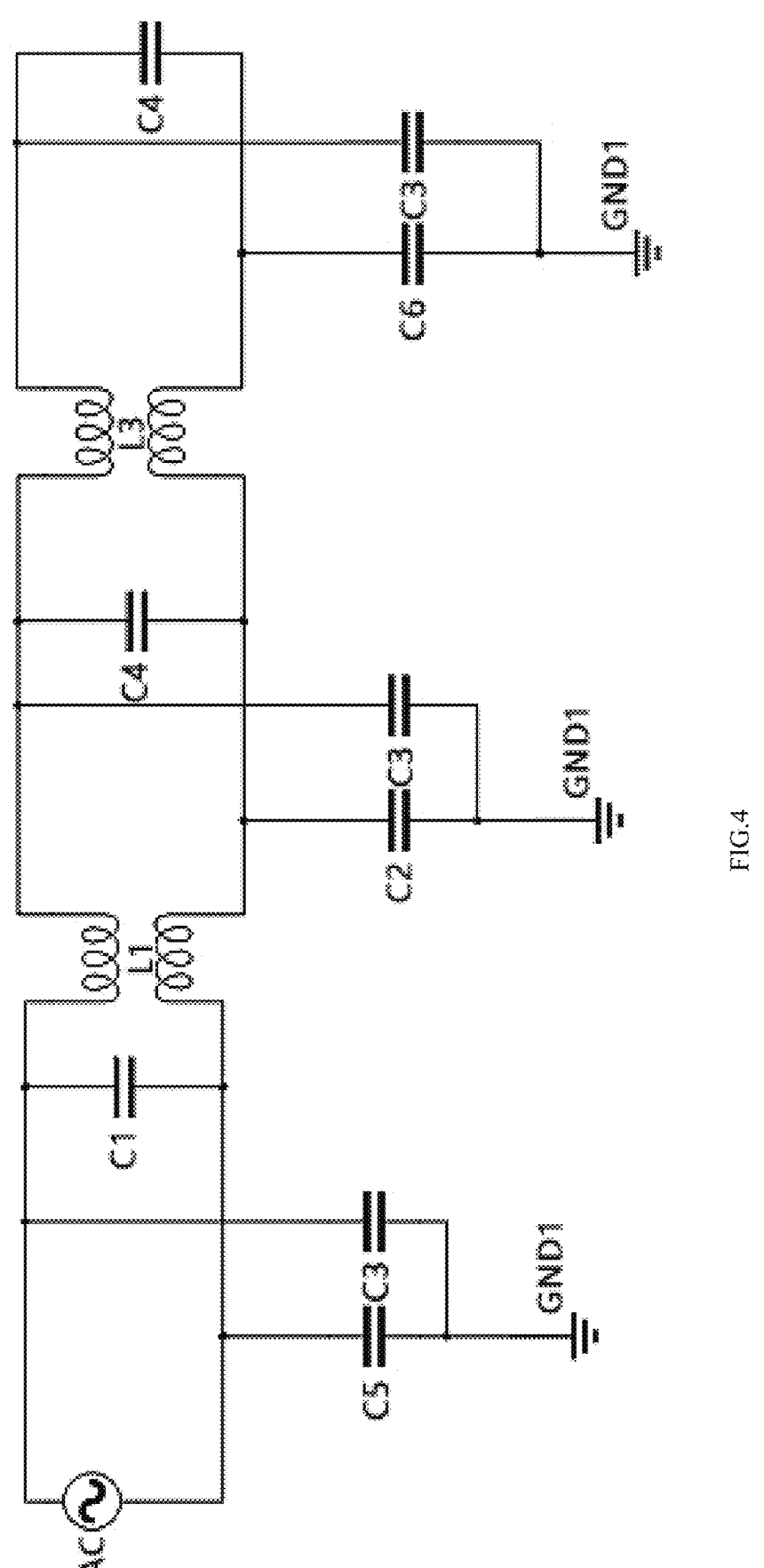
FIG. 4 is a circuit diagram showing that the EMC wave filter of the present invention acts as an input-end AC wave filter of an on-board charger.

FIG. 4 is a circuit diagram showing that the EMC wave filter of the present invention acts as an input-end AC wave filter of an on-board charger. Wherein, C1 and two C4s constitute the X capacitor 44, and C2, C5, C6 and three C3s constitute the Y capacitor 45; L1 represents the first filter inductor 42, and L3 represents the second filter inductor 43. By way of adjusting the different parameters of the X capacitor 44, the Y capacitor 45, the first filter inductor 42 and the second filter inductor 43 in the EMC waver filter, the EMC filter 4 can act as an AC filter of the input end of the on-board charger OBC.

The EMC filter proposed by the present invention can also act as a high-voltage HV filter of the output end of the on-board charger OBC.

The above content only acts as a better embodiment of the present invention, not used to pose any limitation on the present invention, and any modifications, equivalent substitutions, improvements and the likes made within the essence and principle of the present invention will fall within the protection scope of the present invention.

What is claimed is:

1. An EMC wave-filter shielding structure comprising:
   an EMC filter board;
   a lower shield cover that is installed on one side of the EMC filter board, and connected with the EMC filter board around to form a shielding cavity;
   a X capacitor, a Y capacitor, a first filter inductor and a second filter inductor that are all arranged in the shielding cavity and correspondingly connected with the EMC filter board, respectively; and
   an upper shield cover that is installed on the other side of the EMC filter board backing toward the shielding cavity, and directly opposite to the lower shield cover;
   wherein the EMC wave-filter shielding structure further includes a connecting holder, which is arranged in the shielding cavity and connected with the EMC filter board; the first filter inductor and the second filter inductor are installed on the connecting holder;
   wherein the connecting holder includes a connecting plate, of which one surface is connected with the EMC filter board through a plurality of connecting supports, and the first filter inductor and the second filter inductor are installed on the other surface of the connecting plate backing toward the connecting supports;
   wherein the X capacitor and the Y capacitor are arranged between the connecting plate and the EMC filter board, and correspondingly soldered on the EMC filter board, respectively.

2. An EMC waver filter using the EMC wave-filter shielding structure according to claim 1, comprising a housing, a main power circuit board installed inside the housing, and a power transmission terminal installed at one end of the housing, wherein the EMC waver filter further includes the EMC wave-filter shielding structure arranged inside the housing, one end of the EMC filter board is connected with the power transmission terminal, and the other end of the EMC filter board is connected with the main power circuit board through a power connection terminal.

3. The EMC waver filter according to claim 2, wherein of the upper shield cover one end is fixedly connected to the EMC filter board through a supporting foot, and the other end stands against the power connection terminal.

4. The EMC waver filter according to claim 2, wherein one end of the EMC filter board is provided with a plurality of soldering slots, and one end of the power transmission terminal 8 extending into the housing is soldered to a plurality of the soldering slots in a one-to-one correspondence manner through a plurality of power transmission pins.

5. The EMC waver filter according to claim 2, wherein the EMC filter acts as an AC filter of an input end of an on-board charger OBC or a HV filter of an output end of an on-board charger OBC.

6. The EMC wave-filter shielding structure according to claim 1, wherein a folded edge is set on a peripheral side of the top end of the lower shield cover close to the EMC filter board, and the folded edge is provided with a plurality of threaded holes; a plurality of dodging holes that are directly opposite to a plurality of the threaded holes in a one-to-one manner are set on a peripheral side of the EMC filter plate; a plurality of sinking stands that are directly opposite to a plurality of the threaded holes in a one-to-one manner are set on a peripheral side of the upper shield cover, and each sinking stand is provided with a through hole; thus, the upper shield cover, the EMC filter board and the lower shield cover are connected with each other as a whole by way of passing a plurality of screws through the through holes, the dodging holes and the threaded holes directly opposite to each other.

7. The EMC wave-filter shielding structure according to claim 1, wherein a thermally-conductive adhesive is applied between the EMC filter board and the X capacitor, Y capacitor, first filter inductor and second filter inductor in the shielding cavity.

8. An EMC waver filter using the EMC wave-filter shielding structure according to claim 1, comprising a housing, a main power circuit board installed inside the housing, and a power transmission terminal installed at one end of the housing, wherein the EMC waver filter further includes the EMC wave-filter shielding structure arranged inside the housing, one end of the EMC filter board is connected with the power transmission terminal, and the other end of the EMC filter board is connected with the main power circuit board through a power connection terminal.

9. The EMC waver filter according to claim 8, wherein of the upper shield cover one end is fixedly connected to the EMC filter board through a supporting foot, and the other end stands against the power connection terminal.

10. The EMC waver filter according to claim 8, wherein one end of the EMC filter board is provided with a plurality of soldering slots, and one end of the power transmission terminal 8 extending into the housing is soldered to a plurality of the soldering slots in a one-to-one correspondence manner through a plurality of power transmission pins.

11. The EMC waver filter according to claim 8, wherein the EMC filter acts as an AC filter of an input end of an on-board charger OBC or a HV filter of an output end of an on-board charger OBC.

* * * * *